United States Patent
Vashchenko et al.

(10) Patent No.: US 7,800,127 B1
(45) Date of Patent: Sep. 21, 2010

(54) ESD PROTECTION DEVICE WITH CONTROLLABLE TRIGGERING CHARACTERISTICS USING DRIVER CIRCUIT RELATED TO POWER SUPPLY

(75) Inventors: Vladislav Vashchenko, Palo Alto, CA (US); Alexander Burinskiy, San Jose, CA (US); Peter J. Hopper, San Jose, CA (US); Vladimir Kuznetsov, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 531 days.

(21) Appl. No.: 11/503,593

(22) Filed: Aug. 14, 2006

(51) Int. Cl.
 *H01L 23/62* (2006.01)
(52) U.S. Cl. ............... 257/173; 257/E29.181
(58) Field of Classification Search ........... 257/107, 257/112, 111, 144; 251/129.04, 68; 236/51; 361/156, 203, 179
See application file for complete search history.

(56) References Cited

U.S. PATENT DOCUMENTS

| | | | | |
|---|---|---|---|---|
| 1,503,722 A | * | 8/1924 | Strickland | 172/369 |
| 4,957,273 A | * | 9/1990 | Sears | 251/129.04 |
| 5,539,233 A | * | 7/1996 | Amerasekera et al. | 257/362 |
| 5,747,834 A | * | 5/1998 | Chen et al. | 257/111 |
| 5,808,342 A | * | 9/1998 | Chen et al. | 257/357 |
| 5,959,332 A | * | 9/1999 | Ravanelli et al. | 257/360 |
| 6,069,034 A | * | 5/2000 | Gregory | 438/201 |
| 6,803,259 B2 | * | 10/2004 | Lee | 438/133 |
| 6,841,829 B1 | * | 1/2005 | Vashchenko et al. | 257/362 |
| 7,023,028 B2 | * | 4/2006 | Jensen | 257/111 |
| 2001/0010382 A1 | * | 8/2001 | Gregory | 257/373 |
| 2003/0075726 A1 | * | 4/2003 | Ker et al. | 257/107 |
| 2004/0100746 A1 | * | 5/2004 | Chen et al. | 361/56 |
| 2004/0104437 A1 | * | 6/2004 | Zecri et al. | 257/362 |
| 2005/0145947 A1 | * | 7/2005 | Russ et al. | 257/356 |
| 2006/0268478 A1 | * | 11/2006 | Lai et al. | 361/56 |
| 2007/0097570 A1 | * | 5/2007 | Chatty et al. | 361/56 |
| 2007/0228412 A1 | * | 10/2007 | Yang et al. | 257/173 |
| 2008/0253046 A1 | * | 10/2008 | Lou et al. | 361/56 |

\* cited by examiner

*Primary Examiner*—Leonardo Andújar
*Assistant Examiner*—William Harriston
(74) *Attorney, Agent, or Firm*—Jurgen Vollrath; Vollrath & Associates

(57) ABSTRACT

In an ESD device for fast switching applications based on a BSCR or NLDMOS-SCR, an anode junction control electrode is provided by not connecting the anode electrode to the collector of the BSCR or to the drain of the NLDMOS-SCR, and a cathode junction control electrode is provided by forming an additional n+ region in the BSCR or an additional p+ region in the p-well of the NLDMOS-SCR. The triggering voltage of the ESD device is adjusted after a time delay by controlling one or both of the control electrodes using an RC-timer-driver circuit.

8 Claims, 4 Drawing Sheets

ESD PROTECTION DEVICE WITH CONTROLLABLE TRIGGERING CHARACTERISTICS USING DRIVER CIRCUIT RELATED TO POWER SUPPLY

FIELD OF THE INVENTION

The invention relates to Electrostatic Discharge (ESD) devices. In particular it relates to an ESD solution for fast switching applications.

BACKGROUND OF THE INVENTION

Voltage regulators involve high speed switching. Thus electrostatic discharge (ESD) protection using a local clamp approach for protecting such voltage regulators presents a challenge since the switching time of the regulator during normal operation is 10 ns-200 ps and is comparable to and may be significantly lower than the ESD pulse rise time (10 ns for Human Body Model (HBM) pulse).

Typically local protection ESD protection cells or devices are designed to trigger before their voltage breakdown level is reached. This is called the dV/dt effect and is the result of device turn-on due to early triggering rather than due to breakdown voltage being reached. In fact, in the case of high voltage devices the dV/dt effect becomes the major consideration in ESD device design since there is not much blocking junction to choose from.

A common local clamp ESD protection approach is based on SCR snapback devices. In particular, to avoid additional process steps in BiCMOS and BCD processes, the SCR devices are commonly based on NPN BJT and NLDMOS based SCR devices. A typical NPN BJT is shown in FIG. 1 and an ESD device based on an NPN BJT structure, referred to as a bipolar SCR (BSCR) is shown in FIG. 2. Similarly, FIG. 3 shows a typical NLDMOS, while an SCR device based on the NLDMOS structure (referred to as an LDMOS-SCR) is shown in FIG. 4. In each case the SCR device is formed by embedding an additional parasitic PNP structure by means of an additional p-emitter region as is discussed in greater detail below.

The NPN BJT 100 of FIG. 1 includes an emitter 102 formed on top of a p-base 104 and an n-collector 106 with its sub-collector region in the form of an n-sinker 108 and an n-buried layer (NBL) 110 formed in an n-epitaxial region 112. For ease of comparison, the corresponding regions in the BSCR 200 have made use of the same numbering. As shown in FIG. 2, the BSCR 200 provides a pnpn structure by including an extra p– region 202 (also referred to as the p-SCR-emitter region 202) separated from the n+ collector 106 by a shallow trench isolation region (STI) 204 and from the p-base 104 by a second STI region 206. The extra p-region region 202 defines a parasitic PNP structure with the n-regions of the n-sinker, NBL 110 and n-epitaxial region 112, and with the p-region of the p-base 104.

In order to achieve high voltage tolerance at submicron dimension the blocking junction electrodes (contact 220 to collector 106 and contact 224 to base 104) in the ESD device are shorted to the corresponding p-SCR-emitter 202 and cathode emitter 102. This is best understood with respect to the equivalent circuit diagram of FIG. 5. The collector contact 220, which defines the blocking junction connection, is connected to the p-SCR-emitter contact 222, which is in turn connected to the pad to define the anode, while the p-base contact 224 which controls a second blocking junction is connected to the emitter connector 226, the base contact 224 and emitter contact 226 being connected to ground and defining the cathode. The equivalent circuit of FIG. 5, which shows the internal resistance of the drift blocking junction regions as $r_C$ and $r_B$.

The NLDMOS 300, is shown in FIG. 3. It includes an n+ drain 302 formed in an n-well 304, and an n+ source 306 formed in a p-well or p-body 308. In order to provide a bulk contact 310 to the p-body or p-well 308, a p+ region 312 is formed in the p-well 308. As shown in FIG. 3, the source contact 314, which forms the cathode, is connected to the bulk contact 310, and both are connected to ground. The drain contact 316, in turn, forms the anode and is connected to the pad. A gate 320 is formed over the channel region between the drain and the source and is separated from the n+ drain 302 by a shallow trench isolation (STI) region 321. As shown, the n-well 304 and p-well 308 are formed in an n-epitaxial layer 322 with an NBL 324 below the epitaxial layer 322.

The NLDMOS-SCR 400 of FIG. 4 is similar to the NLDMOS 300 and corresponding regions are therefore depicted by the same reference numerals. The NLDMOS-SCR differs in that an additional p+ region 402 is formed in the n-well 304. In the embodiment shown, the p+ emitter region 402 is formed on the gate side adjacent the n+ drain 302. A floating n+ region 404 is formed on the gate to side of the p+ region 402 to provide proper junction isolation, and is separated from the gate 320 by a shallow trench isolation region 410.

It will be appreciated that the additional p+ region 402 (also referred to as the p-SCR-emitter) defines a parasitic PNP transistor with the n-well 304 and p-well 308 with its p+ bulk contact region 312. The p+ region 402 also provides for the SCR's pnpn configuration as defined by the p+ region 402, the n-region (as defined by the n-well 304, the n-epi 322, and the NBL 324), the p-well 308, and the n+ source region In order to achieve high voltage tolerance at submicron dimension the respective blocking junction electrodes in the ESD device (contact 316 to n+ drain 302 and p+ bulk contact 310 to bulk contact region 312) are shorted to the corresponding p-SCR-emitter and cathode source as is also evident from the equivalent circuit diagram of FIG. 6. As shown, the drain contact 316, which defines the blocking junction connection, is connected to the p-SCR-emitter contact 412, which is connected to the pad to define the anode, while the bulk connector 310 which defines a second blocking junction is connected to the source connector 314, the bulk connector and source connector being connected to ground and defining the cathode. This is best understood with respect to the equivalent circuit of FIG. 6, which shows the internal resistance of the drift blocking junction regions as $r_D$ and $r_B$.

SUMMARY OF THE INVENTION

According to the invention there is provided an ESD protection structure, comprising an pnpn configuration in the form of a BSCR that includes an n+ collector connected to an n-sinker and n-buried layer (NBL), a base, and an emitter, as well as an additional p+ region defining an anode, or an NLDMOS-SCR device that includes an n+ drain in an n-well, an n+ source and a p+ bulk contact region in a p-well, as well as an extra p+ region defining an anode, the ESD protection structure further comprising a cathode blocking junction electrode (also referred to as cathode control electrode) defined by an additional n+ region in the BSCR or an additional p+ region in the p-well of the NLDMOS-SCR.

Further, according to the invention, there is an ESD protection structure, comprising an pnpn configuration in the form of a BSCR that includes an n+ collector connected to an n-sinker and n-buried layer (NBL), a base, and an emitter, as well as an additional p+ region defining an anode, or an NLDMOS-SCR device that includes an n+ drain in an n-well, an n+ source and a p+ bulk contact region in a p-well, as well as an extra p+ region defining an anode, the ESD protection structure further comprising an anode blocking junction electrode (also referred to as anode control electrode) defined by not connecting the additional p+ region to the n+ collector of the BSCR or to the n+ drain of NLDMOS-SCR and using the n+ collector of the BSCR or the n+ drain of the NLDMOS-SCR as the anode control electrode. At least one of the anode control electrode or cathode control electrode is preferably controlled by an active control circuit with RC time delay. The active control circuit may be an RC-timer-driver circuit. The active control circuit may connect one or both of the anode control electrode to the anode terminal, and the cathode control electrode to the cathode terminal.

DETAILED DESCRIPTION OF THE INVENTION

In order to implement an ESD protection solution for fast switching time devices such as switching voltage regulators, the present invention makes use of pnpn structures such as the BSCR and NLDMOS-SCR discussed above. However, in addition, one or more blocking junction control electrodes are provided.

Figure 1:
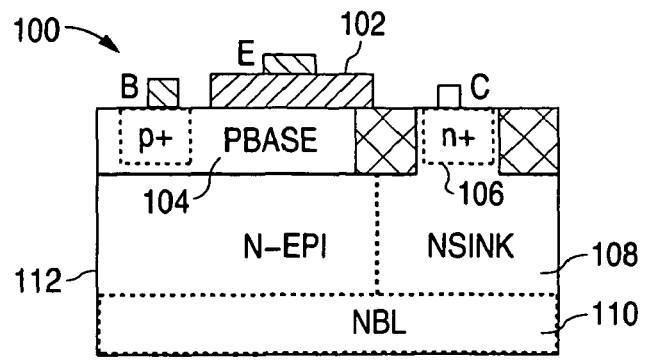
FIG. 1 is a cross-section through a prior art NPN BJT.
Figure 2:
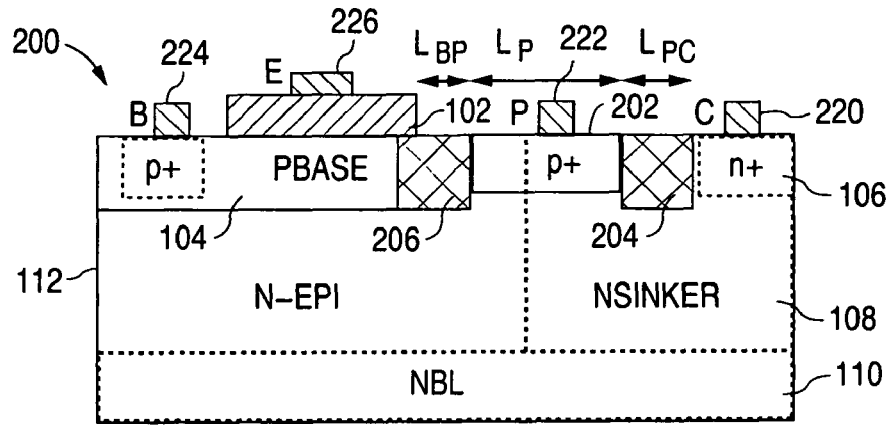
FIG. 2 is a cross-section through a prior art BSCR ESD protection device.
Figure 3:
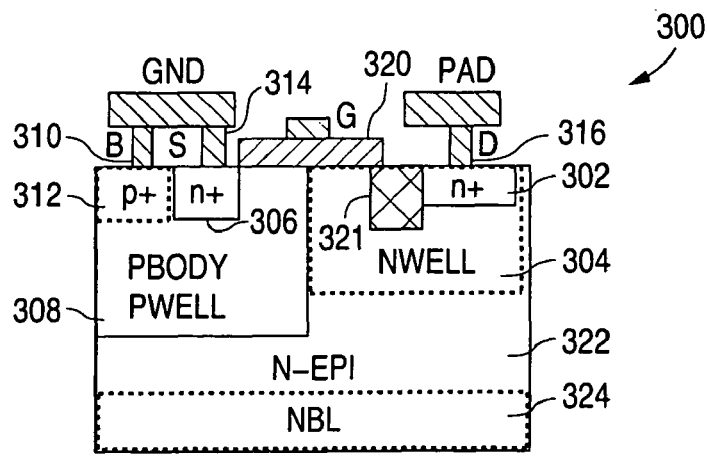
FIG. 3 a cross-section through a prior art NLDMOS.
Figure 7:
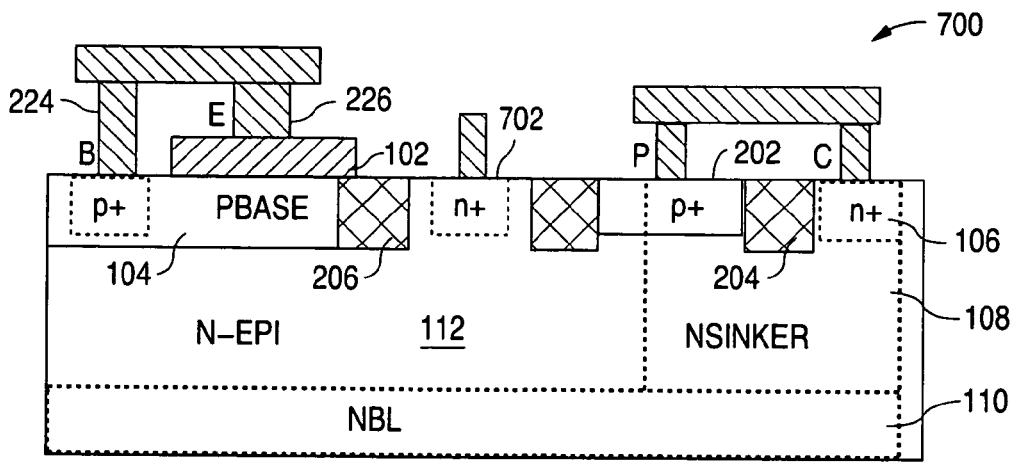
FIG. 7 is a cross-section through a BSCR ESD protection device of the invention showing a cathode control electrode.
Figure 8:
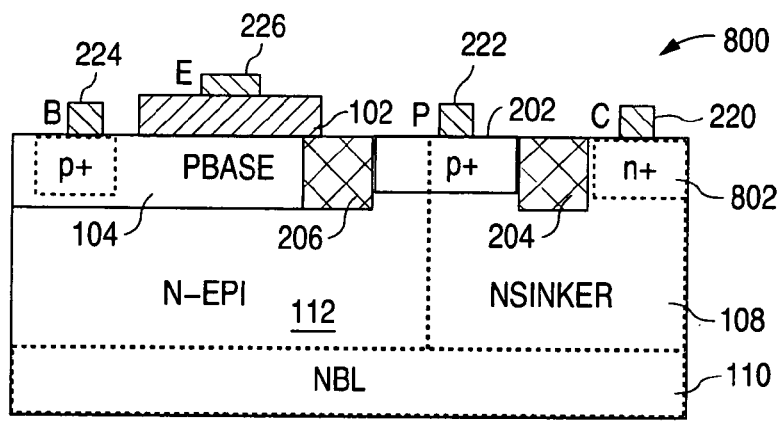
FIG. 8 is a cross-section through a BSCR ESD protection device of the invention showing an anode control electrode, FIG. 9 cross-section through an NLDMOS-SCR ESD protection device of the invention showing an anode control electrode, FIG. 10 cross-section through an NLDMOS-SCR ESD protection device of the invention showing a cathode control electrode.

Two embodiments based on a BSCR are shown in FIG. 7 and FIG. 8. To avoid duplication, the same reference numerals were used to depict similar elements to those in the FIG. 2 BSCR. The FIG. 7 embodiment of the BSCR 700 further includes a separate blocking junction control region 702 with a contact defining an electrode for providing control of the blocking junction on the cathode side. In the BSCR 800 of FIG. 8 the control electrode is defined by the n+ collector 802 which is separated from the p+ emitter 202 to form a separate junction electrode that is not connected to the p+ drain.

Figure 4:
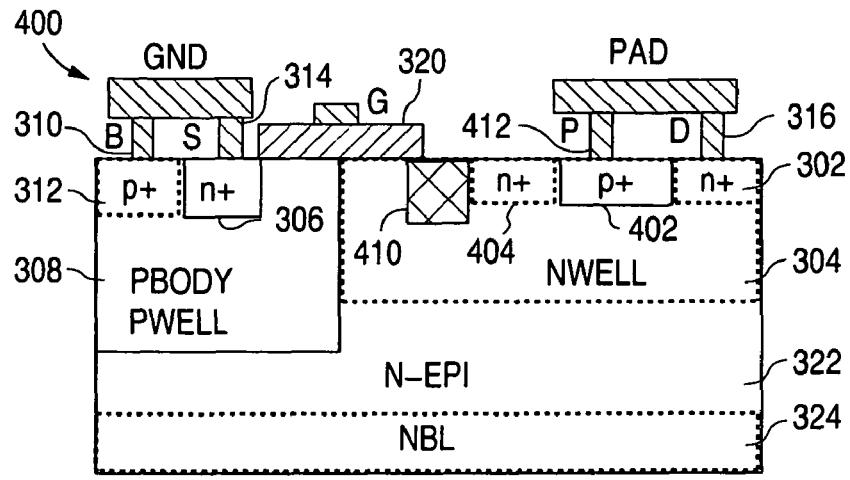
FIG. 4 a cross-section through a prior art NLDMOS-SCR ESD protection device.
Figure 5:
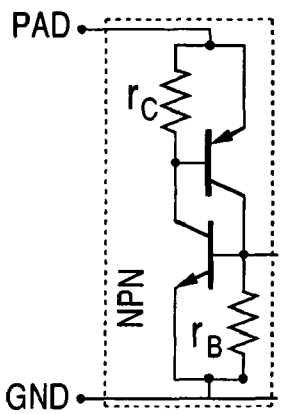
FIG. 5 is an equivalent circuit diagram of a BSCR ESD protection device such as that shown in FIG. 2.
Figure 6:
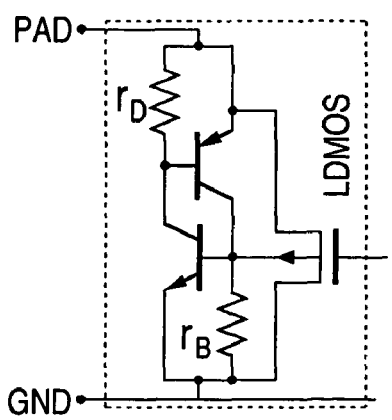
FIG. 6 is an equivalent circuit diagram of an NLDMOS-SCR ESD protection device such as that shown in FIG. 4.
Figure 9:
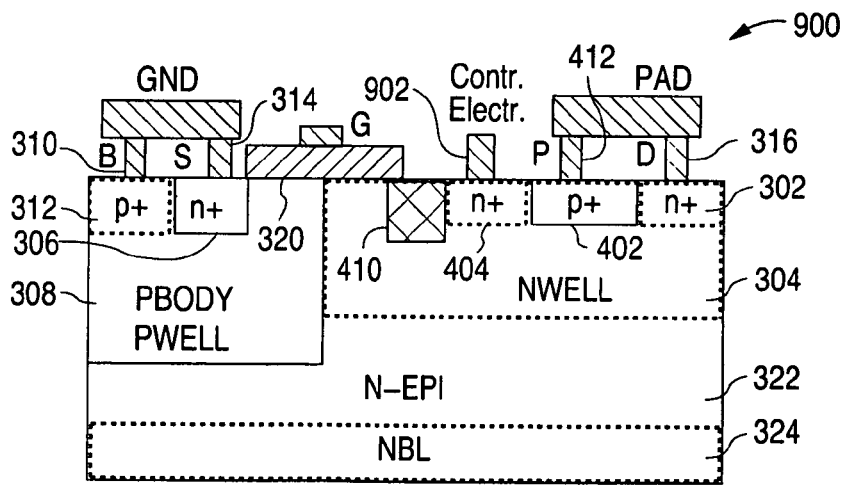
Figure 10:
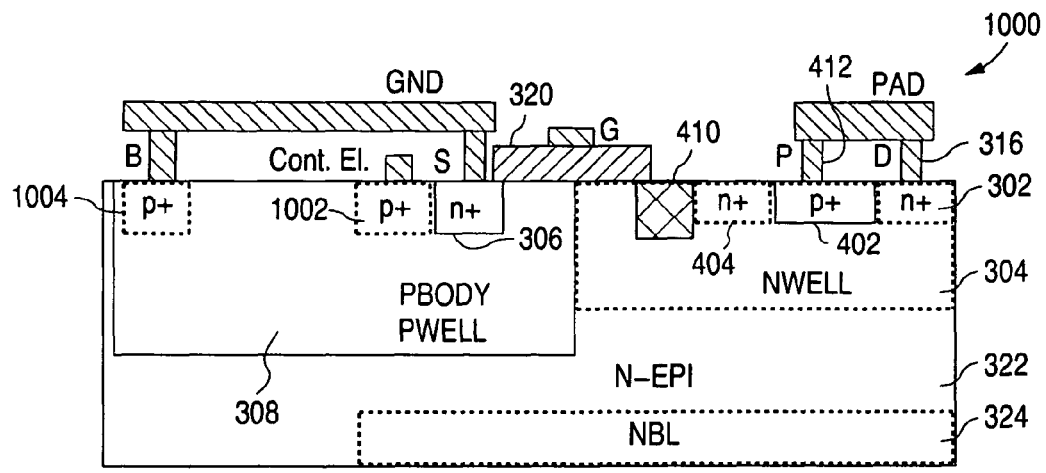

NLDMOS-SCR ESD protection devices of the invention are shown in FIGS. 9 and 10. The NLDMOS-SCR ESD device 900 defines an additional separate blocking junction control electrode by providing the n+ region 404 with a metal contact 902. Thus n+ region 404 becomes the anode blocking junction control electrode. The other elements are similar to those depicted in FIG. 4, therefore the same reference numerals have been used to depict similar regions in FIG. 9.

The NLDMOS-SCR 1000 of FIG. 10, in turn, provides a blocking junction control region 1002 with a contact defining a control electrode on the cathode side. The p+ bulk contact 312 of FIG. 4 now takes the form of a bulk contact 1004 that has been moved out further away from the gate 320 but is still connected to the source 306 as shown in FIG. 10.

Figure 11:
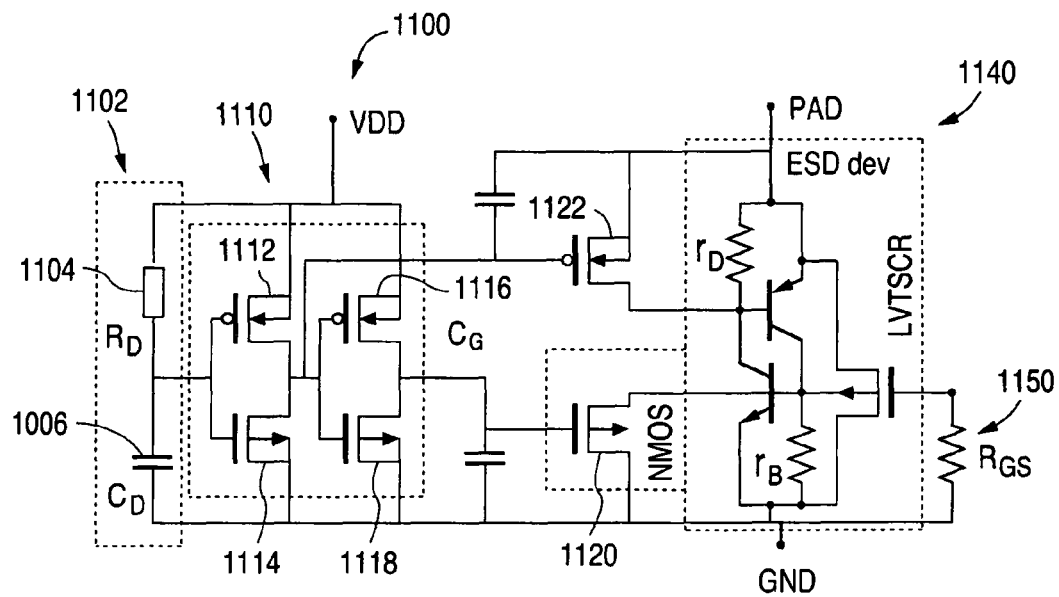
FIG. 11 is an equivalent circuit diagram of an NLDMOS-SCR ESD protection device of the invention connected to a driver circuit for the anode and cathode electrodes.

As part of the invention, one or both of the anode and cathode control electrodes are connected to an RC time delay. An implementation of such a time delay, in the form of an RC-timer-driver circuit is shown in FIG. 11. The RC-timer-driver circuit 1100 includes an RC circuit 1102 in the form of a resistor 1104 and a capacitor 11106; a pre-driver stage 1110 in the form of a first PMOS 1112 and first NMOS 1114 transistor defining a first inverter, and a second PMOS 1116 and second NMOS 1118 defining a second inverter; and a driver stage in the form of an NMOS 1120 and a PMOS 1122. In this embodiment the RC-timer-driver is connected to an NLDMOS-SCR 1140 of the invention. In particular, the NMOS 1120 is connected to the cathode control electrode of the NLDMOS-SCR 1140, while the PMOS driver 1122 is connected to the anode control electrode of the NLDMOS-SCR 1140. It will thus be appreciated that the equivalent circuit diagram of the NLDMOS-SCR 1140 combines the structures of FIGS. 9 and 10 by providing both an anode control electrode and a cathode control electrode. In another embodiment only one of the control electrodes (either the anode control electrode or the cathode control electrode) is connected to the RC-timer-driver circuit 1100.

During ESD testing prior to being powered by the power supply, the ESD device operates in snapback mode and operation is based on punch-through. This occurs at relatively low voltages. During operation of the protected switching device, which involves fast switching, latch-up is avoided by increasing the turn-on voltage and operating the device in active mode. This is achieved by changing the blocking junction of the NLDMOS-SCR 1140 due to the effect of the blocking junction control circuit 1100. When the RC-timer-driver circuit 1100 is powered is by VDD, the circuit 1100 produces a control signal to the control electrodes of the NLDMOS-SCR 1140 after a time delay as dictated by the RC circuit 1102. In particular the connections of the driver NMOS 1120 and driver PMOS 1122 provide shunting of the anode control electrode to the anode, and shunting of the cathode control electrode to the cathode. The effect is an increased triggering voltage characteristic. In contrast during ESD test prior to power-up, the control circuit 1100 provides high impedance to the control electrodes of the ESD device 1140, thereby avoiding the increased triggering voltage.

In the embodiment of FIG. 11, an external gate-source resistor 1150 is also provided across the gate 320 (FIGS. 9 and 10) and the source 314 to provide dV/dt effect amplification. This has the effect of decreasing the trigger voltage. While this appears to be contrary to the intention of increasing the trigger voltage, the resistor 1150 remains the same prior to and after VDD is applied. Also, by varying the resistor 1150 value, the turn on can be tailored more precisely. The dynamic changing of the triggering voltage before VDD is applied and afterwards, is still achieved by virtue of the RC-timer-driver circuit 1100.

While a specific example of an RC-timer-driver was discussed above and was done with respect to an NLDMOS-SCR ESD device, it will be appreciated that the timer controller can be implemented in different ways and can control one or two control electrodes of the ESD device.

What is claimed is:

1. An ESD protection structure, comprising an pnpn configuration in the form of a BSCR that includes an n+ collector connected to an n-sinker and n-buried layer (NBL), a base, and an emitter (defining a cathode terminal), as well as an additional p+ region defining an anode, or in the form of an NLDMOS-SCR device that includes an n+ drain in an n-well, an n+ source (defining a cathode terminal) and a p+ bulk contact region in a p-well, as well as an extra p+ region defining an anode, the ESD protection structure further comprising a cathode blocking junction electrode (also referred to as cathode control electrode) defined by an additional n+ region with blocking junction contact and located between the p+ anode and the base in the BSCR or an additional p+ region in the p-well of the NLDMOS-SCR.

2. An ESD protection structure of claim 1, wherein the cathode control electrode is controlled by an RC-timer-driver circuit with RC time delay.

3. An ESD protection structure of claim 2, wherein the RC-timer-driver circuit comprises an RC-timer-driver circuit.

4. An ESD protection structure of claim 3, wherein the RC-timer-driver circuit is connected between the cathode control electrode and the cathode terminal.

5. An ESD protection structure, comprising an pnpn configuration in the form of a BSCR that includes an n+ collector connected to an n-sinker and n-buried layer (NBL), a base, and an emitter, as well as an additional p+ region defining an anode with an anode contact, or in the form of an NLDMOS-SCR device that includes an n+ drain in an n-well, an n+ source and a p+ bulk contact region in a p-well, as well as an extra p+ region defining an anode, the ESD protection structure further comprising an anode blocking junction electrode (also referred to as anode control electrode) with a control junction contact defined in a BSCR by not connecting the additional p+ region to the n+ collector of the BSCR and using the n+ collector of the BSCR as the anode control electrode, or defined in an NLDMOS-SCR by an additional n+ region formed in the n-well that is provided with an electrode to define an anode control electrode.

6. An ESD protection structure of claim 5, wherein the anode control electrode is controlled by an RC-timer-driver circuit with RC time delay.

7. An ESD protection structure of claim 6, wherein the RC-timer-driver circuit comprises an RC-timer-driver circuit.

8. An ESD protection structure of claim 7, wherein the RC-timer-driver circuit is connected between the anode control electrode and the anode.

* * * * *